United States Patent [19]

Amin et al.

[11] Patent Number: 5,117,394
[45] Date of Patent: May 26, 1992

[54] HIGH SPEED DIFFERENTIAL SENSE AMPLIFIER FOR USE WITH SINGLE TRANSISTOR MEMORY CELLS

[75] Inventors: Alaaeldin A. M. Amin, Dhahran, Saudi Arabia; Bernard Emoto, Midvale, Utah

[73] Assignee: National Semiconductor Corp., Santa Clara, Calif.

[21] Appl. No.: 698,257

[22] Filed: May 6, 1991

Related U.S. Application Data

[63] Continuation of Ser. No. 276,363, Nov. 23, 1988, abandoned.

[51] Int. Cl.$^5$ .............................................. G11C 16/06
[52] U.S. Cl. .................................... 365/203; 365/202; 365/185; 365/208; 365/210
[58] Field of Search .................... 365/104, 185, 189.09, 365/202, 203, 205, 207, 208, 210

[56] References Cited

U.S. PATENT DOCUMENTS

| | | | |
|---|---|---|---|
| 4,475,178 | 10/1984 | Kinoshita | 365/203 |
| 4,654,831 | 3/1987 | Venkatesh | 365/207 |
| 4,725,984 | 2/1988 | Ip et al. | 365/185 |
| 4,802,138 | 1/1989 | Shimamune | 365/208 |
| 4,829,479 | 5/1989 | Mitsumoto et al. | 365/189.09 |
| 4,903,237 | 2/1990 | Rao | 365/185 |

OTHER PUBLICATIONS

"The Technology of a 1MBIT CMOS EPROM", by G. Nelmes, *New Electronics*, vol. 18, No. 22, Nov. 1985, pp. 70–74.

"A 1MB CMOS EPROM with Enhanced Verification", by D. Novosel et al., *1988 IEEE Solid-State Circuits Conference, Digest of Technical Papers*, 17th–19th Feb. 1988, pp. 124–125, 325.

*Primary Examiner*—Glenn Gossage
*Attorney, Agent, or Firm*—Steven F. Caserza; Irv Rappaport

[57] ABSTRACT

A memory circuit incorporates a differential sense amplifier to be utilized in conjunction with a memory array comprised of a plurality of memory cells each containing a single transistor. A high slew rate differential input signal is applied to the sense amplifier based upon the binary data stored in an addressed memory cell. This is accomplished by pre-charging the selected bit line and a reference bit line, and then selecting the word line of the memory cell to be read, while causing the reference memory cell to conduct. The differential voltage between the selected bit line and the reference bit line is then sensed to determine the state of the data stored in the selected memory cell. The ratio of currents through the selected bit line and the reference bit line is selected to be other than one, in order to achieve a rapid differential voltage swing, and rapid reading of the data stored within the selected memory cell.

8 Claims, 3 Drawing Sheets

HIGH SPEED DIFFERENTIAL SENSE AMPLIFIER FOR USE WITH SINGLE TRANSISTOR MEMORY CELLS

CROSS REFERENCE TO RELATED APPLICATIONS

This application is a continuation of U.S. application Ser. No. 07/276,363, filed Nov. 23, 1988 now abandoned.

FIELD OF THE INVENTION

This invention pertains to memory devices, and more particularly, to sense amplifiers for use in determining the data stored in single transistor memory cells, such as EEPROM memory cells.

BACKGROUND OF THE INVENTION

EEPROM devices are well known in the prior art and may be categorized broadly into two groups: those memory arrays which employ memory cells utilizing a single transistor and those memory arrays which employ memory cells which utilize two transistors. The advantage in utilizing two transistors per memory cell is that a differential output signal may be obtained which can be sensed by a differential sense amplifier, providing greater speed of operation and less susceptibility to errors caused by noise. However, utilizing two transistors per memory cell consumes a greater amount of surface area in an integrated circuit than memory devices utilizing a single transistor per memory cell.

FIG. 1 depicts a schematic diagram of a memory device utilizing an array of two transistor memory cells and a differential sense amplifier. For convenience, only a single memory cell formed of transistors 11 and 12 is shown, although it is well known in the art how such memory arrays comprising a plurality of memory cells, each containing two transistors, are formed and selectively addressed. Referring to FIG. 1, floating gate transistors 11 and 12 each include a floating gate which is selectively charged to increase the control gate threshold voltage of the transistor to correspond to a logical zero, as compared with the control gate threshold voltage of a transistor having substantially no charge placed on its floating gate and corresponding to a logical one. In circuit 10 of FIG. 1, transistors 11 and 12 are erased to be in the low threshold voltage state, i.e., each having a threshold voltage corresponding to a logical one. Then, during programming, either transistor 11 or 12 is programmed by placing a charge on its floating gate in order to increase its threshold voltage to correspond to a logical zero, thereby providing a differential data signal on BIT and $\overline{BIT}$ lines 18 and 19, which is in turn applied to the differential input leads of differential sense amplifier 20. Differential sense amplifier 20 in turn provides a single ended output signal on output terminal 21 which is capable of being provided more quickly and with less susceptibility to noise and variations of voltage levels on leads 18 and 19 than is possible if a single input sense amplifier were used, as depicted in the prior art structure of FIG. 2. Table 1 depicts the operation of memory cell 10 shown in FIG. 1 during the erase and programming modes.

TABLE 1

| Programmed State | $V_T$ Transistor 11 | $\overline{BIT}$ | $V_T$ Transistor 12 | BIT |
| --- | --- | --- | --- | --- |
| erased | low | 1 | low | 1 |
| 0 | low | 1 | high | 0 |
| 1 | high | 0 | low | 1 |

As shown in FIG. 2, another type of memory array is constructed of a plurality of memory cells, each containing a single floating gate transistor, such as transistor 31. Again, for simplicity, the entire array of memory cells is not shown, such construction being well known to those of ordinary skill in the art. During reading of a selected memory cell, BIT line 35 is connected to the input lead of single input sense amplifier 37. Sense amplifier 37 is inherently slower (due to its responding to a non-differential input signal which changes voltage in one direction with respect to a reference voltage) and more susceptible to noise and variations in voltage levels on BIT line 35 (due to its lack of common mode noise rejection) than is the differential sense amplifier 20 of FIG. 1 having its input leads connected to both BIT and $\overline{BIT}$ lines.

The prior art circuit of FIG. 3 has combined the use of a memory array having a plurality of memory cells, each containing a single floating gate transistor, with the higher speed and lower susceptibility to noise of a differential sense amplifier. For simplicity, FIG. 3 shows only a single memory cell formed of transistor 101-N-1 associated with row line 102-N and BIT line 103-1. It is readily understood by those of ordinary skill in the art that the memory array actually includes a plurality of N row lines and M BIT lines, and a plurality of N×M uniquely addressable single transistor memory cells.

When transistor 101-N-1 is selected for reading, row line 102-N is enabled by placing a read voltage having a voltage greater than the control gate threshold voltage of a memory array transistor which is programmed to the logical one state (no charge on its floating gate), and less than the control gate threshold voltage of a memory array transistor which is programmed to a logical zero state (a charge placed on its floating gate). BIT line 103-1 is selected by turning on column select transistors 104-1 and 105-1 and applying reference voltage VREF to the gate of transistor 106-1. As shown in FIG. 3, transistors 104-1 and 105-1 serve as column select transistors connected in an AND configuration. Other addressing techniques or the use of other than two select transistors 104-1, 105-1, are well known in the art. The reference voltage applied to the gate of transistor 106-1 is approximately 2.5 to 3 volts and causes transistor 106-1 to precharge the selected column 103-1. When memory array transistor 101-N-1 stores a logical one, it turns on when selected for reading, causing differential sense amplifier input lead 107 to be connected to ground. Conversely, when memory array transistor 101-N-1 stores a logical zero it does not turn on when selected for reading due to its higher control gate threshold voltage. In this case, input lead 107 of differential sense amplifier 111 is not connected to ground, and the current I/2 supplied by array load current source 109 is not discharged to ground but is made available on high impedance input lead 107 of differential sense amplifier 111.

Although not shown in FIG. 3, it is well known in the art that various multiplexing techniques can be used to multiplex a plurality of columns to a single differential sense amplifier, or to multiplex a plurality of output leads from a plurality of differential sense amplifiers to a single output lead of an integrated circuit.

In order to provide a differential input signal to differential sense amplifier 111, a set 117 of reference transistors is provided between differential input lead 108 and ground in the same configuration as those elements located between differential input lead 107 and ground. Thus, reference set 117 includes a reference unprogrammed memory cell 101-N-REF (storing a logical one) and having its control gate connected to row line 102-N. Similarly, reference set 117 includes reference transistors 104-REF and 105-REF corresponding to column select transistors 104-1 and 105-1, respectively, with their control gates connected to VCC (typically 5 volts). Reference set 117 also includes transistor 106-REF having its control gate connected to reference voltage VREF, serving as an analog to transistor 106-1. Reference load current source 110 provides a current I equal to twice the current provided by array load current source 109.

Balancing transistor 118 serves to connect the inverting and noninverting input leads of differential sense amplifier 111 prior to sensing the data stored in the selected memory cell. As shown in FIG. 3, balancing transistor 118 is a P channel transistor controlled by a signal $\overline{BAL}$ applied to its gate electrode which goes high when sensing is to be performed following selection of a desired row and column defining the single memory cell to be sensed by differential sense amplifier 111.

When memory array transistor 101-N-1 stores a logical zero and is selected for reading, differential input lead 107 is not connected to ground and thus when balancing is terminated (i.e., when transistor 118 turns off):

$$\left. \frac{dv}{dt} \right|_{logical\ zero} = \frac{\Delta(V_{107} - V_{108})}{\Delta t} \quad (1)$$

but $$V_{108} = constant \quad (2)$$

and $$\frac{\Delta V_{107}}{\Delta t} = \frac{\frac{1}{2}I}{C_{107}} \quad (3)$$

Thus $$\left. \frac{dv}{dt} \right|_{logical\ zero} = \frac{\frac{1}{2}I}{C_{107}} ; \quad (4)$$

where
$\Delta V_{107}$ = the rate of change of the voltage on differential input lead 107;
$V_{108}$ = the constant reference voltage to be compared to the voltage of sense node 107;
I = The reference current through reference Bit line 103-REF;
$\Delta t$ = a change in time;
$C_{107}$ = the capacitance on input lead 107; and
dv/dt = the time rate of change of the differential input voltage between differential input leads 107 and 108.

Conversely, when memory array transistor 101-N-1 stores a logical one and is selected for reading $$\left. \frac{dv}{dt} \right|_{logical\ one} = \frac{\Delta(V_{108} - V_{107})}{\Delta t} \quad (5)$$

from equation (2)

$$\left. \frac{dv}{dt} \right|_{logical\ one} = \frac{-\Delta V_{107}}{\Delta t} \quad (6)$$

from equation (3)

$$\left. \frac{dv}{dt} \right|_{logical\ one} = \frac{-\frac{1}{2}I}{C_{107}} \quad (7)$$

Unfortunately, the rate of change of differential input voltage in the prior art circuit of FIG. 3 is only one half that developed by a prior art circuit, such as shown in FIG. 1, which utilizes two transistors per memory cell. Thus, the prior art circuit of FIG. 3 is slower than a prior art circuit which utilizes two transistors per memory cell.

SUMMARY

In accordance with the teachings of this invention, a novel circuit is provided which allows a differential sense amplifier to be utilized in conjunction with a memory array comprised of a plurality of memory cells each containing a single transistor, as well as a reference bit line including a reference memory cell. In accordance with the teachings of this invention, a differential input signal is applied to the sense amplifier based upon the binary data stored in an addressed memory cell at a rate equal to or greater than the differential input signal available in prior art differential memory cells having two transistors per cell. This is accomplished by precharging the selected bit line and the reference bit line, and then selecting the word line of the memory cell to be read, while causing the reference memory cell to conduct. The differential voltage between the selected bit line and the reference bit line is then sensed to determine the state of the data stored in the selected memory cell. The ratio of currents through the selected bit line and the reference bit line is selected to be other than one, in order to achieve a rapid differential voltage swing, and rapid reading of the data stored within the selected memory cell.

These and other features and advantages of the invention will be more readily apparent upon reading the following description of a preferred exemplified embodiment of the invention and upon reference to the accompanying drawings wherein:

BRIEF DESCRIPTION OF THE DRAWINGS

FIGS. 4a-4c define the schematic representations of N channel, P channel, and memory cell transistors shown in the schematic diagram of FIG. 4.

DETAILED DESCRIPTION

Figure 1:
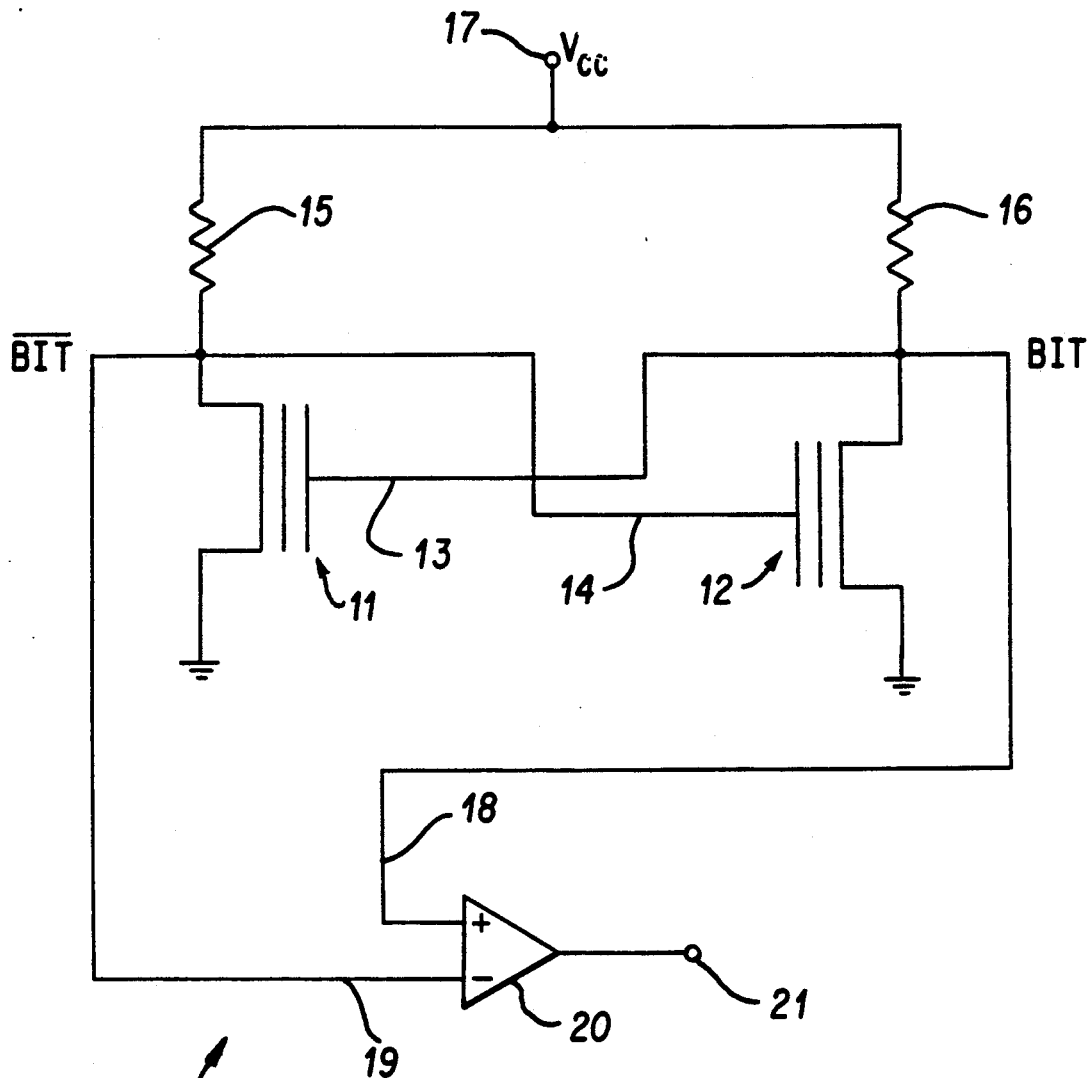
FIG. 1 is a schematic diagram of a typical prior art memory device including a differential memory cell consisting of two transistors.
Figure 2:
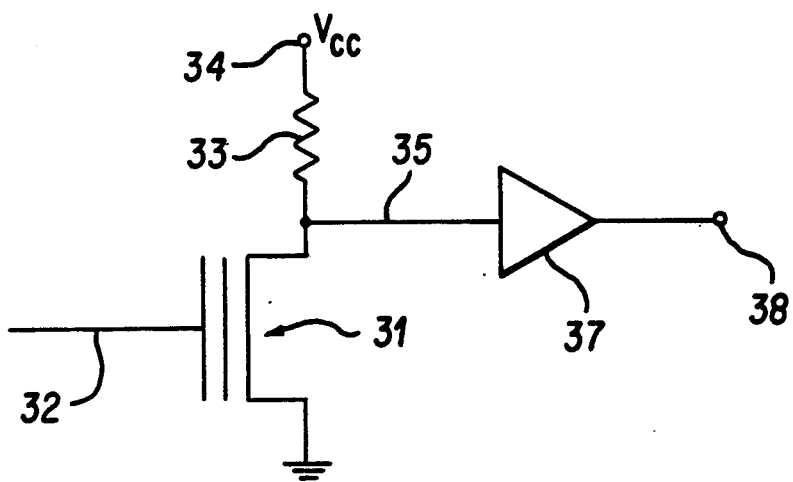
FIG. 2 is a schematic diagram of a typical prior art memory device including a single transistor memory cell and a single ended sense amplifier.
Figure 3:
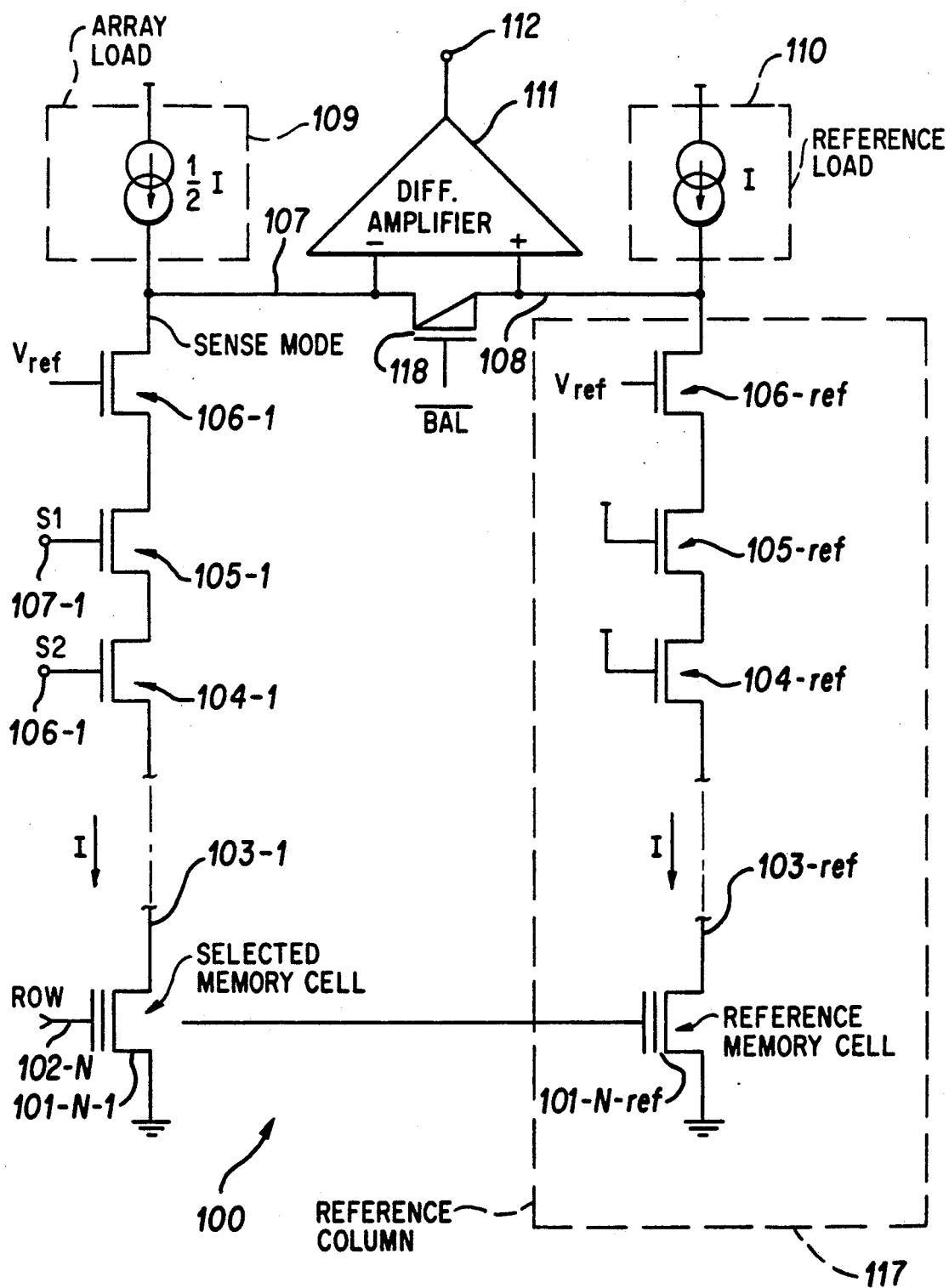
FIG. 3 is a schematic diagram of a prior art memory device utilizing single transistor memory cells and a differential sense amplifier.
Figure 4:
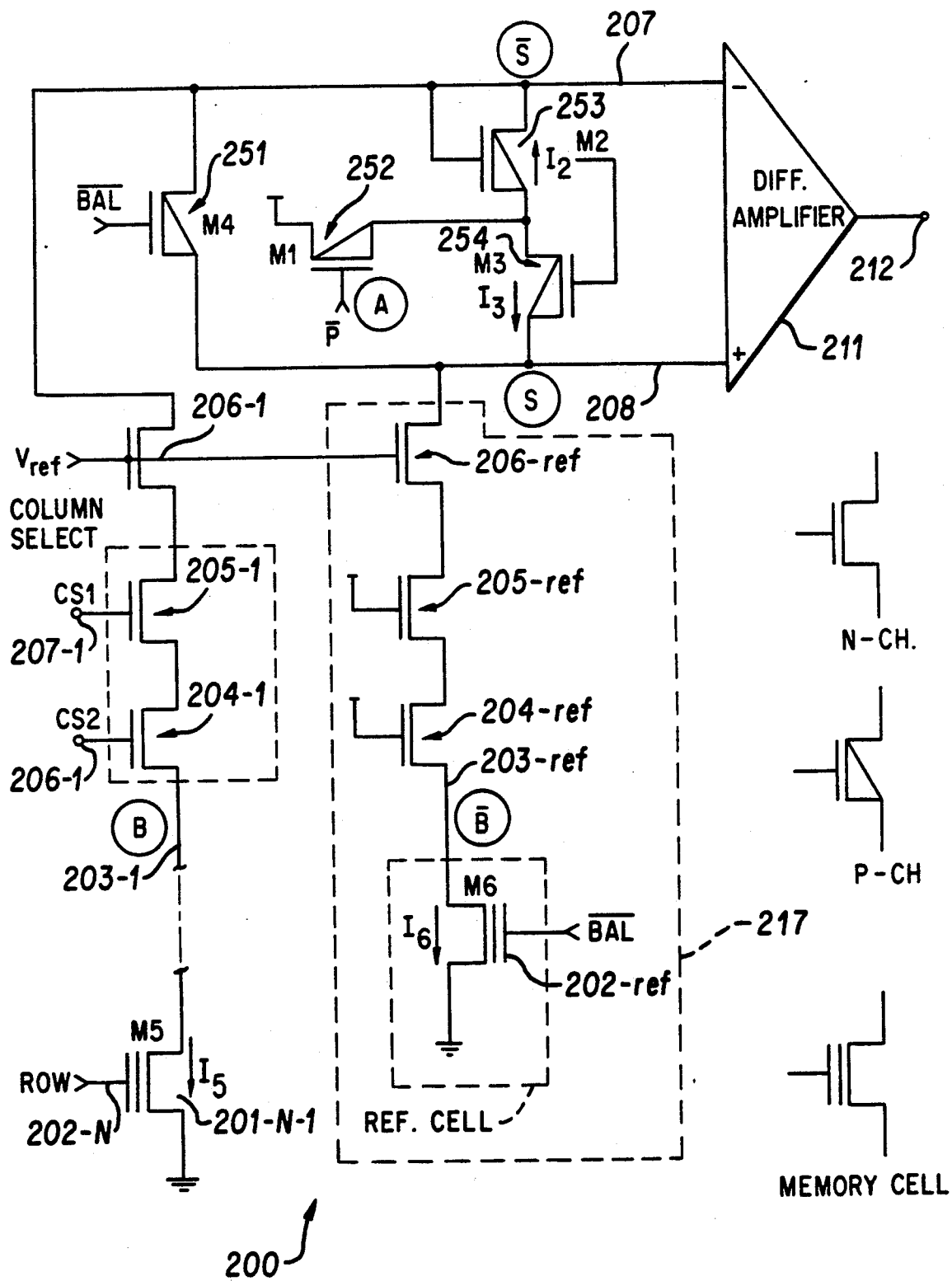
FIG. 4 is a schematic diagram of one embodiment of a memory device constructed in accordance with the teachings of this invention which utilizes single transistor memory cells and a differential sense amplifier.

One embodiment of a memory array circuit constructed in accordance with the teachings of this invention is shown in the schematic diagram of FIG. 4. FIGS. 4a-4c define the schematic representations of N channel, P channel, and memory cell transistors shown in the schematic diagram of FIG. 4. Once again, only a single memory array transistor 201-N-1 is shown, although it is to be understood that the memory array comprises a plurality of such memory cells arranged in columns, the memory cells in a column having their sources connected in common, their drains connected in common, and their control gates connected to individual row lines such as row line 202-N. Connected between BIT line 203-1 and differential input lead 207 are column select transistors 205-1 and 204-1 and transistor 206-1 having its gate connected to reference voltage VREF, as in the prior art embodiment of FIG. 3. Similarly, reference set 217 includes transistors 204-REF, 205-REF and 206-REF corresponding to transistors 204-1, 205-1, and 206-1, respectively, as in the case of a prior art circuit of FIG. 3. The gates of transistors 204-REF and 205-REF are connected to VCC (typically 5 volts) and the gate of transistor 206-REF is connected to reference voltage VREF. However, unlike the prior art, reference memory array transistor cell 202-REF has its control gate connected to a balancing signal $\overline{BAL}$. In addition, transistors 251 through 254 are used to precharge BIT line 203-1 and reference line 203-REF.

When suitable circuitry (not shown), for example of a well-known design, detects that the address signal applied to the memory array has changed, thereby indicating that a different memory array transistor has been selected for reading, precharge signal $\overline{P}$ and balancing signal $\overline{BAL}$ go low, thereby turning off reference cell 202-REF and turning on P channel transistors 251 and 252. The source of P channel transistor 252 is connected to VCC. Since memory cell transistor 201-N-1 has been selected for reading, column select transistors 204-1 and 205-1 are turned on, as is transistor 206-1, and thus BIT line 203-1 is precharged via conducting P channel transistors 252 and 254. Since P channel transistors 253 and 254 have their sources connected in common and their gates connected in common, the ratio a of currents $I_2$ and $I_3$ through transistors 253 and 254, respectively, is equal to the ratio between the sizes of transistors 253 and 254, so that $$\alpha = \frac{I_3}{I_2} \tag{8}$$

In one embodiment, transistor 254 is chosen to be 2.5 times the size of transistor 253 and thus $$\alpha = 2.5 \tag{9}$$

At this time, differential input leads 207 and 208 are precharged to a voltage level of VCC-VTP, where
VCC = the power supply voltage (typically about 5 volts); and
VTP = the threshold voltage of P channel transistors (typically about 1 volt).

After a time sufficient to allow BIT line 203-1 and reference line 203-REF to precharge (typically approximately 20-30 nanoseconds), balance signal $\overline{BAL}$ goes high, thus turning on reference cell transistor 202-REF and turning off balancing transistor 251. At this time, the differential signal developed between differential input leads 207 and 208 when selected memory cell 201-N-1 stores a logical one (low control gate threshold voltage) is defined as follows:

$$I_5 = I_6 = I_{cell} \tag{10}$$

and, since the selected memory transistor turns on, $$I_2 = I_5 = I_{cell} \text{ and} \tag{11}$$

$$I_3 = \alpha I_2 = \alpha I_{cell}; \tag{12}$$

where
$I_2$ = the current through P channel transistor 253;
$I_3$ = the current through P channel transistor 254;
$I_5$ = the current through BIT line 203-1;
$I_6$ = the current through reference cell 202-REF and thus through reference bit line 203-REF; and
$I_{cell}$ = the current through a memory cell transistor storing a logical one when selected for reading.

Thus, $$\left. \frac{dv}{dt} \right|_{logical\ one} = \frac{\Delta(V_{208} - V_{207})}{\Delta t} \tag{13}$$

but since $V_{207}$ = constant $$\left. \frac{dv}{dt} \right|_{logical\ one} = \frac{\Delta V_{208}}{\Delta t} \tag{14}$$

$$\frac{\Delta V_{208}}{\Delta t} = \frac{I_3 - I_6}{C_{208}} \tag{15}$$

from equations (12) and (10)

$$\left. \frac{dv}{dt} \right|_{logical\ one} = \frac{(\alpha - 1) I_{cell}}{C_{208}}; \tag{16}$$

where
$\Delta V_{208}$ = the change in voltage on differential input lead 208;
$\Delta V_{207}$ = the change in voltage on differential input lead 207; and
$C_{208}$ = the capacitance on differential input lead 208.
For the embodiment where $\alpha = 2.5$, $$\left. \frac{dv}{dt} \right|_{logical\ one} = \frac{1.5\ I_{cell}}{C_{208}} \tag{17}$$

In a typical memory device constructed in accordance with the teachings of this invention, when $\alpha = 2.5$, this three fold increase in $$\left. \frac{dv}{dt} \right|_{logical\ one}$$

as compared to the prior art circuit of FIG. 3 results in a three fold improvement in the sense amplifier reading time of a logical one, since the bit line capacitance $C_{208}$ of this invention is equal to the bit line capacitance $C_{107}$ of the prior art circuit of FIG. 3. Naturally, α can be made to any value desired, by adjusting the size ratio of transistors 253 and 254, thus altering the improvement in reading speed of a logical one with respect to the prior art circuit of FIG. 3.

Conversely, after BIT line 203-1 and reference line 203-REF are precharged, the differential input signal across leads 207 and 208 when the selected memory array transistor 207-N-1 stores a logical zero (high control gate threshold voltage) is determined as follows:

$$\left.\frac{dv}{dt}\right|_{logical\ one} = \frac{\Delta(V_{208} - V_{207})}{\Delta t} \tag{18}$$

but since $V_{207}$=constant, $$\left.\frac{dv}{dt}\right|_{logical\ zero} = \frac{\Delta V_{208}}{\Delta t} \tag{19}$$

from equation (14)

$$\left.\frac{dv}{dt}\right|_{logical\ zero} = \frac{I_3 - I_6}{C_{208}} \tag{20}$$

Since $I_3=0$ (since precharging has ceased), and $I_6 = I_{cell}$ (from equation 10), $$\left.\frac{dv}{dt}\right|_{logical\ zero} = \frac{-I\ cell}{C_{208}} \tag{21}$$

In a typical memory device constructed in accordance with the teachings of this invention, this two fold increase in $$\left.\frac{dv}{dt}\right|_{logical\ zero}$$

as compared to the prior art circuit of FIG. 3 results in a two fold inprovement in the sense amplifier reading time of a logical one, since the bit line capacitance $C_{208}$ of this invention is equal to the bit line capacitance $C_{107}$ of the prior art circuit of FIG. 3.

It has been discovered that transistors 253 and 254 need not be made very large, but only sufficiently large to conduct currents $I_2$ and $I_3$, respectively. However, should transistor 253 be made rather large, a slight transient voltage will appear on differential input lead 207 when the BAL goes high and balancing transistor 251 turns off. If this occurs, it is preferable to wait a short period of time to allow the transient voltage on lead 207 to settle prior to sensing the stored data being addressed. Typically, when a relatively large transistor 253 is used, one need only wait 5 to 10 nanoseconds or so after balancing transistor 251 turns off prior to sensing the state of the stored data.

Thus, in accordance with the teachings of this invention, a novel memory circuit is provided which provides a differential signal which develops at a rate equal to or greater than that of a true differential signal developed utilizing a two transistor memory cell.

Although the foregoing invention has been described in some detail by way of illustration and example for purposes of clarity of understanding, it will be readily apparent to those of ordinary skill in the art in light of the teachings of this application that certain changes and modifications may be practiced within the scope of the appended claims.

We claim as our invention:

1. A memory device comprising:
   a plurality of bit lines;
   a plurality of word lines;
   a plurality of memory cells, each memory cell being uniquely associated with a bit line-word line pair;
   means for addressing a selected bit line;
   means for addressing a selected word line;
   a reference bit line coupled to a reference memory cell comprising a reference memory transistor programmed to a first logical state and having a source coupled to said reference bit line, a drain coupled to a selected voltage level, and a control gate coupled to a control signal;
   a differential sense amplifier having a first input lead coupled to said selected bit line, a second input lead coupled to said reference bit line, and an output lead for providing an output signal indicative of the logical state of the data stored in a selected memory cell defined by said selected bit line and said selected word line;
   balancing means for selectively causing said first and second input leads to be at the same voltage;
   a precharge source having a precharge output terminal;
   first means for coupling said precharge output terminal to said first input lead of said sense amplifier in order to provide a selected bit line charging current; and
   second means for coupling said precharge output terminal to said second input lead of said sense amplifier, in order to provide a reference bit line charging current; wherein said control signal in a first state selectively causes said reference memory transistor to conduct, and in a second state selectively causes said balancing means to cause said first and second input leads to be at the same voltage level.

2. A memory device as in claim 1 wherein:
   said precharge source comprises a transistor having a first source/drain terminal coupled to a voltage source, a second source/drain terminal coupled to said precharge output terminal, and a control gate coupled to a precharge control signal;
   said first means for coupling comprises a transistor having a first source/drain terminal coupled to said second source/drain terminal of the transistor of said precharge source, a second source/drain terminal coupled to said first input lead, and a control gate coupled to said first input lead; and
   said second means for coupling comprises a transistor having a first source/drain terminal coupled to said second source/drain terminal of the transistor of said precharge source, a second source/drain terminal coupled to said second input lead, and a control gate coupled to said first input lead.

3. A memory device as in claim 2 wherein the transistors of said first and second means for coupling are sized to supply a predetermined ratio of current to said selected bit line and said reference bit line.

4. A memory devise comprising:
   a plurality of bit lines;
   a plurality of word lines;

a plurality of memory cells, each memory cell being uniquely associated with a bit line-word line pair;

means for addressing a selected bit line;

means for addressing a selected word line;

a reference bit line coupled to a reference memory cell comprising a reference memory transistor programmed to a first logical state and having a source coupled to said reference bit line, a drain coupled to a selected voltage level, and a control gate coupled to a control signal;

a differential sense amplifier having a first input lead coupled to said selected bit line, a second input lead coupled to said reference bit line, and an output lead for providing an output signal indicative of the logical state of the data stored in a selected memory cell defined by said selected bit line and said selected word line;

balancing means for selectively causing said first and second input leads to be at the same voltage;

a precharge source comprising a transistor having a first source/drain terminal coupled to a voltage source, a second source/drain terminal coupled to a precharge output terminal, and a control gate coupled to a precharge control signal;

first means for coupling said precharge output terminal to said first input lead of said sense amplifier in order to provide a selected bit line charging current, said first means for coupling comprising a transistor having a first source/drain terminal coupled to said second source/drain terminal of the transistor of said precharge source, a second source/drain terminal coupled to said first input lead, and a control gate coupled to said first input lead; and second means for coupling said precharge output terminal to said second input lead of said sense amplifier in order to provide a reference bit line charging current, said second means for coupling comprising a transistor having a first source/drain terminal coupled to said second source/drain terminal of the transistor of said precharge source, a second source/drain terminal coupled to said second input lead, and a control gate coupled to said first input lead.

5. A memory device as in claim 4 wherein the transistors of said first and second means for coupling are sized to supply a predetermined ratio of current to said selected bit line and said reference bit line.

6. A method of operating a memory device which includes:

a plurality of bit lines;

a plurality of word lines;

a plurality of memory cells, each memory cell being uniquely associated with a bit line-word line pair;

means for addressing a selected bit line;

means for addressing a selected word line;

a reference bit line coupled to a reference memory cell;

a differential sense amplifier having a first input lead coupled to said selected bit line, a second input lead coupled to said reference bit line, and an output lead for providing an output signal indicative of the logical state of the data stored in a selected memory cell defined by said selected bit line and said selected word line;

balancing means for selectively causing said first and second input leads to be at the same voltage level;

a precharge source having a precharge output terminal;

first means for coupling said precharge output terminal to said first input lead in order to provide a selected bit line charging current, said first means for coupling comprising a transistor having a first source/drain terminal coupled to said precharge output terminal of said precharge source, a second source/drain terminal coupled to said first input lead, and a control gate coupled to said first input lead; and second means for coupling said precharge output terminal to said second input lead in order to provide a reference bit line charging current, said second means for coupling comprising a transistor having a first source/drain terminal coupled to said precharge output terminal of said precharge source, a second source/drain terminal coupled to said second input lead, and a control gate coupled to said first input lead;

said method comprising the steps of:

selecting a desired memory cell by selecting its associated bit line and word line;

precharging said selected bit line and said reference bit line;

causing said first and second input leads of said sense amplifier to have the same voltage potential;

allowing the voltages on said first and second input leads to change based on the current provided by said first and second means for coupling through said selected bit line and said reference bit line, respectively; and sensing the voltages on said first and second input leads to provide said output signal.

7. A method as in claim 6 wherein said reference memory cell is turned off during said step of precharging.

8. A method as in claim 7 wherein said reference memory cell is turned on during said step of sensing.

* * * * *